United States Patent
Wagner et al.

(10) Patent No.: US 6,658,368 B2
(45) Date of Patent: Dec. 2, 2003

(54) ON-CHIP HISTOGRAM TESTING

(75) Inventors: Israel Wagner, Ramat Gan (IL); Tibi Galambos, Binyamina (IL)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 09/815,751

(22) Filed: Mar. 23, 2001

(65) Prior Publication Data

US 2002/0138231 A1 Sep. 26, 2002

(51) Int. Cl.$^7$ .......................... H03M 1/10; G06F 19/00

(52) U.S. Cl. .................. 702/180; 702/106; 341/120

(58) Field of Search ............................ 341/120, 126, 341/155; 702/180, 106, 107, 117

(56) References Cited

U.S. PATENT DOCUMENTS

| | | | |
|---|---|---|---|
| 4,897,650 A | * 1/1990 | Shott et al. | 341/120 |
| 5,793,642 A | 8/1998 | Frisch et al. | 364/490 |
| 6,128,353 A | * 10/2000 | Ho et al. | 375/345 |
| 6,177,894 B1 | * 1/2001 | Yamaguchi | 341/120 |
| 6,211,803 B1 | * 4/2001 | Sunter | 341/120 |
| 6,326,909 B1 | * 12/2001 | Yamaguchi | 341/120 |
| 6,476,741 B1 | * 11/2002 | Cherubal et al. | 341/120 |
| 2001/0035834 A1 | * 11/2001 | Variyam et al. | 341/120 |
| 2002/0005794 A1 | * 1/2002 | Yamaguchi | 341/120 |

OTHER PUBLICATIONS

Azais et al., "Towards an ADC BIST Scheme Using the Histogram Test Technique", IEEE, 2000.*

Toner et al., "Histogram–Based Distortion and Gain Tracking Testing of an 8–bit PCM Mixed Analog–Digital IC Chip", IEEE, 1992.*

Larrabee et al., "Using Sine Wave Histograms to Estimate Analog-to-Digital Converter Dynamic Error Functions", IEEE, 1998.*

Doernberg et al., "Full–Speed Testing of A/D Converters", IEEE, 1984.*

Blair, J., "Histogram Measurement of ADC Nonlinearities Using Sine Waves", IEEE Transactions on Instrumentation and Measurement, vol. 43, No. 3, Jun. 1994, pp. 373–383.

Fluence–Opmaxx, "Bist & Distributed Test Solutions", on–line product information (compilation from website), 2000, http://www.opmaxx.com, pp. 1–51.

Almy, T., Opmaxx, Inc., "Habist™ Case Study", http://www.fluence.com/bistmaxx/habist_casestudy.pdf., Aug. 1999, pp. 1–8.

Burns, M. et al., *An Introduction to Mixed–Signal IC Test and Measurement*, Oxford University Press, 2001, New York, pp. 462–467.

Agilent Technologies, "Agilent 54750A High–Bandwidth Digitizing Oscilloscope", 2000, p. 1, product information.

Zagursky, V. et al., "Testing Technique for Embedded ADC", presented Jul. 8, 1997, session 5: Analog & Mixed Signal On–Line Testing at the Third International On–Line Testing Workshop, Crete, Greece, pp. 775–778.

(List continued on next page.)

*Primary Examiner*—Patrick Assouad
(74) *Attorney, Agent, or Firm*—Darby & Darby

(57) ABSTRACT

Circuitry for generating a histogram of output codes produced by an analog/digital converter (ADC) on an integrated circuit chip includes a comparator, disposed on the chip together with the ADC. A first input of the comparator is coupled to receive output codes from the ADC, while a second input is coupled to receive a sequence of target codes covering at least a portion of a range of the output codes. A pulse generator is disposed on the chip together with the ADC and the comparator, and coupled to receive the output of the comparator and, when the output is in the first state, to generate pulses for output from the chip at a pulse rate determined by a clock signal of the ADC.

23 Claims, 3 Drawing Sheets

OTHER PUBLICATIONS

Wagdy, M. et al., "Determining ADC Effective Number of Bits Via Histogram Testing", IEEE Transactions on Instrumentation and Measurement, 40:4, Aug. 1991, pp. 770–772.

Vinnakota, B., *Analog and Mixed-Signal Test*, Prentice Hall PTR, 1998, New Jersey, USA, Chapter 5, "Design for Test", pp. 111–118.

Peetz, B., "Dynamic Testing of Waveform Recorders", IEEE Transactions on Instrumentation and Measurement, vol. IM–32, No. 1, Mar. 1983, pp. 1–6.

ITC Oct. $3^{rd}$ 2000—Fluence DACBIST Design Toolkit. "Fluence Technology's New Built–In Self–Test Toolkit Slashes Test Development Time for Digital to Analog Converter BIST", http://www.fluence.com/news/press_releases/DACBIST–ITC–1032000.html, pp. 1–2.

Arabi, K. et al., "Oscillation Built–In Self Test (OBIST) Scheme for Functional and Structural Testing of Analog and Mixed–Signal Integrated Circuits", International Test Conference, paper 31.4, pp. 786–795.

Agilent Technologies, "E4430B ESG–D Series Digital RF Signal Generator", product description, 2000, p. 1.

* cited by examiner

ON-CHIP HISTOGRAM TESTING

FIELD OF THE INVENTION

The present invention relates generally to testing of integrated circuit components, and specifically to design-for-test (DFT) of analog and mixed-signal integrated circuits.

BACKGROUND OF THE INVENTION

Histogram testing is a well-known method for dynamic evaluation of analog-to-digital converter (ADC) devices. Typically, a sine wave of known frequency and amplitude is input to the ADC. The digital codes that are output by the ADC in response to the sine wave are recorded in a histogram, which is used to reveal both global characteristics and local errors of the device. For example, Peetz describes a number of uses of ADC histogram testing in an article entitled, "Dynamic Testing of Waveform Recorders," *IEEE Transactions on Instrumentation and Measurement* IM-32:1 (March, 1983), pages 12–17, which is incorporated herein by reference. These uses include obtaining the differential nonlinearity of the ADC, determining whether any missing codes exist at the input test frequency, and measuring gain and offset at the test frequency. Wagdy et al. point out that histogram testing can also be used to determine the effective number of bits of the ADC, in "Determining ADC Effective Number of Bits Via Histogram Testing," *IEEE Transactions on Instrumentation and Measurement* 40:4 (August, 1991), pages 770–772, which is also incorporated herein by reference.

Modern, high-speed ADCs are designed to operate at frequencies in excess of 3 GHz. At these speeds, it is very difficult to collect histogram data using conventional off-chip test equipment. To address this problem, design-for-test (DFT) and built-in self test (BIST) techniques have been developed. These concepts are described generally by Vinnakota in *Analog and Mixed-Signal Test* (Prentice Hall PTR, Upper Saddle River, N.J., 1998), which is incorporated herein by reference. DFT techniques involve modifying a circuit on a chip to facilitate testing of the circuit, typically by improving fault coverage and/or making internal elements of the chip accessible for testing by external equipment. BIST also involves circuit modifications, but goes a step farther than DFT by actually embedding the test generator in the chip itself. Both DFT and BIST techniques generally require the addition of on-chip hardware, which is used only in the verification stage of chip development and is left thereafter as unused chip "real estate."

Fluence Technology, Inc. (Beaverton, Oreg.), offers a histogram-based BIST system for on-chip testing, known as HABIST™. Aspects of this system are described in U.S. Pat. No. 5,793,642, whose disclosure is incorporated herein by reference. HABIST is intended particularly for use in testing high-performance ADCs. An analog test signal is generated by an on-chip source and is input to the ADC under test. A reference histogram, derived from either the test signal itself or from a simulation of the signal, is stored in a memory on chip. While the test signal is running, an on-chip histogram generator counts the occurrences of each of the possible output codes of the ADC and stores the results in a memory on the chip. It thus assembles the actual histogram of the ADC output. The reference histogram is subtracted from the actual histogram to give a variance histogram, which is then compressed, encoded and passed to an analyzer off chip in order to evaluate the circuit. It is sufficient for the link between the chip and the analyzer to operate at low speed, because both the high-speed test signal and the histogram are generated on chip, and only the encoded variance histogram need be passed to the analyzer. This convenience of operation is achieved, however, at the cost of substantial additional on-chip hardware, including analog circuits for generating the input test signal. Furthermore, the range of frequencies, amplitudes and waveform types that can be applied in the input signal to the ADC are limited to what the embedded analog test circuitry can offer.

SUMMARY OF THE INVENTION

Preferred embodiments of the present invention enable very high-speed histogram measurements to be made on analog integrated circuit components, without requiring analog test signal generation circuits on chip. A test waveform, typically a high-frequency sinusoid, is input to the chip under test from a standard signal generator via a suitable radio frequency (RF) probe. An ADC on the chip generates digital output codes responsive to the waveform. The ADC output is compared to a sequence of target codes using a simple on-chip comparator. Whenever the output code matches the target code, a "1" is output to a standard counter, which is connected to the chip by a second RF probe. By stepping the target code through the range of possible values of the output codes, and counting the matches for each code, a histogram of the ADC output is generated.

Thus, in preferred embodiments of the present invention, the ADC histogram is produced using substantially simpler on-chip test circuitry than what is required by BIST and DFT solutions known in the art. The histogram is generated and analyzed using standard, off-chip test equipment, with only a few RF probes connected to the chip itself for signal input and comparator readout. The histogram is analyzed by the off-chip equipment to determine characteristics of the analog components on the chip, and particularly of the ADC, such as the number of effective bits, differential nonlinearity and other properties, as mentioned in the Background of the Invention.

There is therefore provided, in accordance with a preferred embodiment of the present invention, circuitry for generating a histogram of output codes produced by an analog/digital converter (ADC) on an integrated circuit chip, the ADC producing the output codes at an output rate determined by a clock signal coupled to the ADC, responsive to an input signal applied to the ADC, the circuitry including:

a comparator, disposed on the chip together with the ADC, and including:
   a first input coupled to receive the output codes from the ADC;
   a second input coupled to receive a sequence of target codes covering at least a portion of a range of the output codes; and
   an output, configured to assume a first state whenever the output and target codes are equal, and a second state when they are not equal; and a pulse generator, disposed on the chip together with the ADC and the comparator, and coupled to receive the output of the comparator and, when the output is in the first state, to generate pulses for output from the chip at a pulse rate determined by the clock signal.

Preferably, the pulse rate is equal to the output rate of the ADC.

Further preferably, the circuitry includes a target code generator, which is coupled to apply each of the target codes in sequence to the second input of the comparator, so as to generate the histogram of the output codes. Preferably, the target code generator is arranged to apply each of the sequence of target codes to the comparator for a substantially equal number of cycles of the clock signal, during which the ADC receives the input signal and generates the output codes.

Additionally or alternatively, the pulse generator is arranged to convey the pulses to a probe applied to the chip, so as to carry the pulses to off-chip test equipment for counting the pulses and producing the histogram of the output codes.

There is also provided, in accordance with a preferred embodiment of the present invention, an integrated circuit chip, including:

an analog/digital converter (ADC), arranged to produce, responsive to an input signal applied to the ADC, a range of digital output codes at an output rate determined by a clock signal coupled to the ADC;

a comparator, including a first input coupled to receive the output codes from the ADC, a second input coupled to receive a sequence of target codes covering at least a portion of the range of the output codes, and an output, configured to assume a first state whenever the output and target codes are equal, and a second state when they are not equal; and a pulse generator, coupled to receive the output of the comparator and, when the output is in the first state, to generate pulses for output from the chip at a pulse rate determined by the clock signal.

Preferably, the ADC is arranged to receive the input signal from a signal probe applied to the chip, which conveys the input signal to the chip from off-chip test equipment.

There is additionally provided, in accordance with a preferred embodiment of the present invention, a method for testing an integrated circuit chip, including:

applying an input signal to analog circuitry on the chip, the circuitry including an analog/digital converter (ADC) that is arranged to produce, responsive to the input signal, a range of digital output codes at an output rate determined by a clock signal coupled to the ADC;

comparing the output codes from the ADC, using a comparator on the chip, to a sequence of target codes covering at least a portion of the range of the output codes, so as to generate pulses for output from the chip at a pulse rate determined by the clock signal whenever the output and target codes are equal; and counting the pulses generated for each of the target codes so as to produce a histogram of the output codes.

Preferably, the method includes analyzing the histogram to determine one or more operating characteristics of the analog circuitry.

There is further provided, in accordance with a preferred embodiment of the present invention, apparatus for generating a histogram of output codes produced by an analog/digital converter (ADC) on an integrated circuit chip, the ADC producing the output codes at an output rate determined by a clock signal coupled to the ADC, responsive to an input signal applied to the ADC, the apparatus including:

a signal generator, arranged to apply the input signal to analog circuitry on the chip, the circuitry including the analog/digital converter (ADC);

test circuitry on the chip, coupled to compare the output codes to a sequence of target codes covering at least a portion of a range of the output codes, so as to generate pulses for output from the chip at a pulse rate determined by the clock signal whenever the output and target codes are equal; and a counter, arranged to receive and count the pulses generated for each of the target codes.

Preferably, the signal generator and the counter include test equipment separate from the chip, and including radio frequency (RF) probes for conveying the input signal to the analog circuitry and for conveying the pulses to the counter.

Further preferably, the apparatus includes a histogram analyzer, coupled to receive pulse counts generated by the counter and to produce the histogram of the output codes, and to analyze the histogram to determine one or more operating characteristics of the analog circuitry.

The present invention will be more fully understood from the following detailed description of the preferred embodiments thereof, taken together with the drawings in which:

DETAILED DESCRIPTION OF PREFERRED EMBODIMENTS

Figure 1:
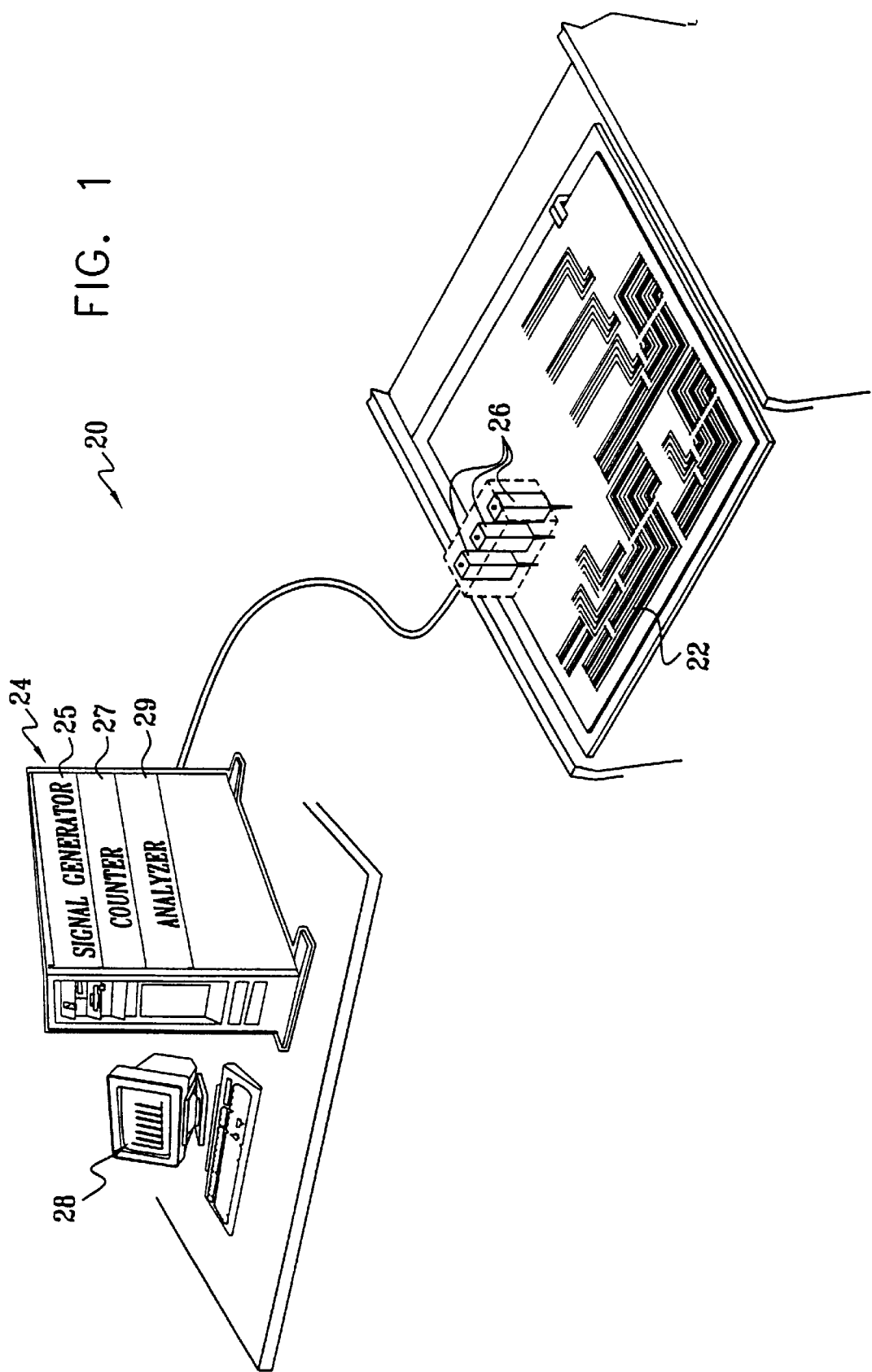
FIG. 1 is a schematic, pictorial illustration of a system for testing an integrated circuit device, in accordance with a preferred embodiment of the present invention.

FIG. 1 is a schematic, pictorial illustration of a system 20 for testing an integrated circuit (IC) chip 22, in accordance with a preferred embodiment of the present invention. Details of chip 22 are described hereinbelow with reference to FIG. 2. System 20 comprises test equipment 24, including a signal generator 25, a counter 27 and a histogram analyzer 29. RF probes 26, as are known in the art, connect equipment 24 to appropriate test points on chip 22. The probes are used to apply to the chip a waveform generated by signal generator 25, and to convey a digital pulse output of the chip to counter 27. The digital output reflects the distribution of digital codes produced by an ADC on the chip. Analyzer 29 receives and processes the counts generated by counter 27 so as to produce a histogram 28 of the counts, giving a distribution of the digital codes generated by the ADC.

The components of equipment 24 are preferably standard test instruments, which are controlled or programmed to carry out the functions of the present invention. Signal generator 25, for example, may comprise an ESG4000A device, produced by Agilent (Hewlett Packard), of Palo Alto, Calif., which is capable of generating sinusoids and other waveforms at frequencies in the GHz range. For accurate histogram analysis, the sinusoid should be as pure a tone as possible, preferably as described by Blair in "Histogram Measurement of ADC Nonlinearities Using Sine Waves," *IEEE Transactions on Instrumentation and Measurement* 43:3 (1994), pages 373–383, which is incorporated herein by reference. Counter 27 preferably comprises a digitizing oscilloscope, such as the Agilent model 120-B, which is configured to operate in a counter mode. Analyzer 29 typically comprises a general-purpose computer or other processor, which is programmed with suitable software to receive the output of counter 27 and perform the required histogram analysis, as well as other applicable analytical functions, as are known in the art.

Figure 2:
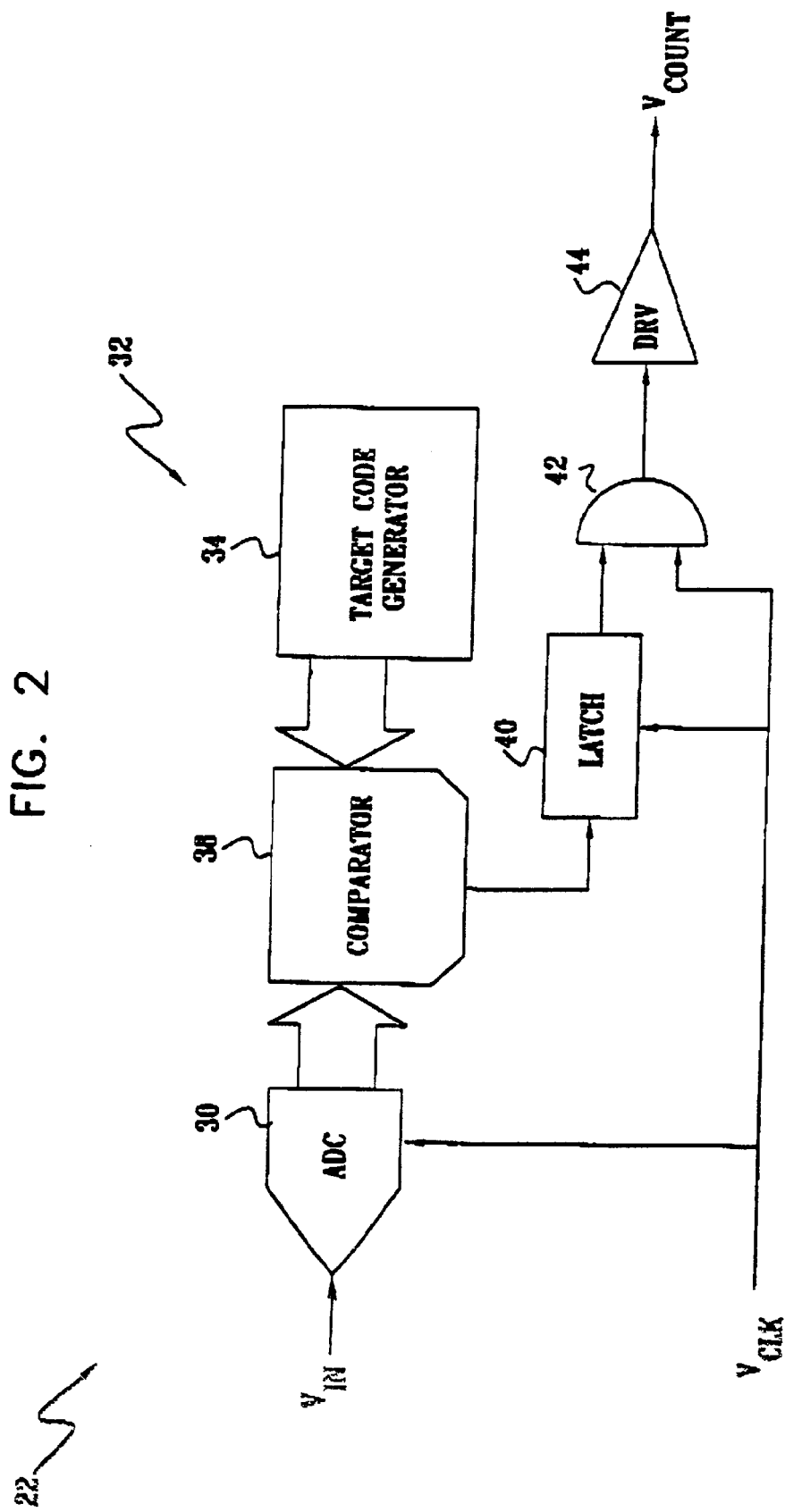
FIG. 2 is a block diagram that schematically illustrates on-chip test circuitry, in accordance with a preferred embodiment of the present invention.

FIG. 2 is a block diagram that schematically illustrates test circuitry 32 in chip 22, used in generating a histogram of the output of an ADC 30 on the chip, in accordance with a preferred embodiment of the present invention. The ADC receives an analog test input VIN from signal generator 25, as described above, and outputs digital codes corresponding to the level of the input voltage, at a rate determined by a clock, $V_{CLK}$, which is preferably generated on chip 22. Typically, the clock rate is on the order of 3 GHz, and ADC 30 is designed to output 5-bit codes, but the method and circuitry described herein are equally applicable to other clock rates and code resolutions. The output of the ADC is preferably in the form of n-bit parallel data.

A n-bit ADC will normally output $2^n$ different codes, depending on the analog input level. A target code generator 34 is programmed or externally controlled to generate each of the different codes in turn. While each of the target codes is output by generator 34, ADC 30 is operated for a predetermined number of cycles of the clock $V_{CLK}$. A comparator 38 compares the ADC output, bit by bit, to the target code held by the adapter. When the codes match, the comparator outputs a "1" to a master/slave latch 40. An AND gate 42 and a driver 44 are used to generate an output pulse train, $V_{COUNT}$, in which a pulse is generated every time comparator 38 produces a "1". These pulses are counted by counter 27 in order to produce histogram 28.

Figure 3:
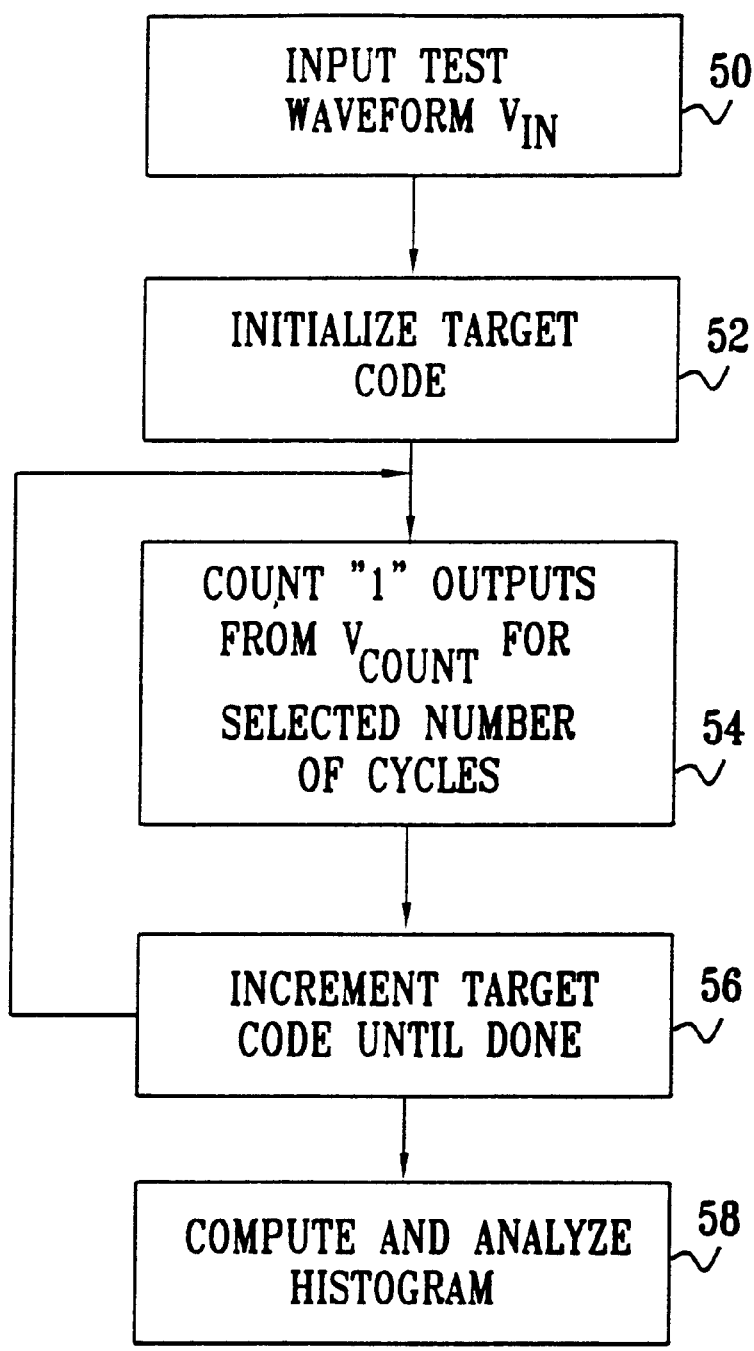
FIG. 3 is a flow chart that schematically illustrates a method for histogram testing, in accordance with a preferred embodiment of the present invention.

FIG. 3 is a flow chart that schematically illustrates a method for generating histogram 28, in accordance with a preferred embodiment of the present invention. The test waveform $V_{IN}$, typically a sinusoid of well-controlled amplitude and frequency, is input to ADC 30, at a signal input step 50. Target code generator 34 inputs an initial target code, for example, 00000, to comparator 38, at an initialization step 56. This target code is held by the comparator while ADC 30 digitizes the input waveform over a selected number of cycles of the clock $V_{CLK}$. During this period, counter 27 counts the number of pulses in the output $V_{COUNT}$, at a counting step 54. The number of pulses is equal to the number of occurrences of the current target code in the sequence of output codes generated by the ADC over the selected number of cycles, for example, the number of times the code 00000 occurred.

After the count is completed for the initial target code, target code generator 34 increments the target code to the next value, say 00001, at an incrementing step 56. The occurrences of this code are counted at step 54, preferably over the same number of cycles as the initial code. Steps 54 and 56 are repeated for the entire range of target codes, until a count has been produced for each of the target codes in the range of interest (typically 00000-11111). Since the occurrences of each code are counted over the same number of clock cycles, based on the same input signal to the ADC, the results of the count are statistically the same as though all of the codes were counted simultaneously, as in histogram generators known in the art. The method of sequential counting provided by this preferred embodiment of the present invention, however, substantially simplifies the on-chip circuitry that is required in order to carry out the count.

After all of the codes have been counted, analyzer 29 processes the results gathered by counter 27 in order to compute the histogram of ADC 30, at a histogram computation step 58. The processor analyzes the histogram to determine properties of the ADC, such as the effective number of bits and differential nonlinearity. Other analyses known in the art may also be applied to the histogram, such as those described in the references mentioned in the Background of the Invention.

Thus, system 20 is capable of generating a complete histogram analysis of ADC 30 using only two RF probes 26 ($V_{IN}$ and $V_{COUNT}$) of moderate speed, together with existing, standard test equipment 24. If desired, a serial/parallel converter may be added to on-chip test circuitry 32, following AND gate 44, so that the output rate of $V_{CLOCK}$ can be reduced still further. Test circuitry 32 on chip 22 is of simple design and requires very little "real estate," by comparison with BIST and DFT solutions known in the art. Although the only analog circuitry shown in the embodiment of FIG. 2 is ADC 34, it will be understood that other analog circuit components may be tested in this manner, as well.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Circuitry for generating a histogram of output codes produced by an analog/digital converter (ADC) on an integrated circuit chip, the ADC producing the output codes at an output rate determined by a clock signal coupled to the ADC, responsive to an input signal applied to the ADC, the circuitry comprising:

a comparator, disposed on the chip together with the ADC, and comprising:
 a first input coupled to receive the output codes from the ADC;
 a second input coupled to receive a sequence of target codes covering at least a portion of a range of the output codes; and
 an output, configured to assume a first state whenever the output and target codes are equal, and a second state when they are not equal; and a pulse generator, disposed on the chip together with the ADC and the comparator, and coupled to receive the output of the comparator and, when the output is in the first state, to generate pulses for output from the chip at a pulse rate determined by the clock signal.

2. Circuitry according to claim 1, wherein the pulse rate is equal to the output rate of the ADC.

3. Circuitry according to claim 1, and comprising a target code generator, which is coupled to apply each of the target codes in sequence to the second input of the comparator, so as to generate the histogram of the output codes.

4. Circuitry according to claim 3, wherein the target code generator is arranged to apply each of the sequence of target codes to the comparator for a substantially equal number of cycles of the clock signal, during which the ADC receives the input signal and generates the output codes.

5. Circuitry according to claim 1, wherein the pulse generator is arranged to convey the pulses to a probe applied to the chip, so as to carry the pulses to off-chip test equipment for counting the pulses and producing the histogram of the output codes.

6. An integrated circuit chip, comprising:

an analog/digital converter (ADC), arranged to produce, responsive to an input signal applied to the ADC, a range of digital output codes at an output rate determined by a clock signal coupled to the ADC;

a comparator, comprising a first input coupled to receive the output codes from the ADC, a second input coupled to receive a sequence of target codes covering at least a portion of the range of the output codes, and an output, configured to assume a first state whenever the output and target codes are equal, and a second state when they are not equal; and a pulse generator, coupled to receive the output of the comparator and, when the output is in the first state, to generate pulses for output from the chip at a pulse rate determined by the clock signal.

7. A chip according to claim 6, wherein the pulse rate is equal to the output rate of the ADC.

8. A chip according to claim 6, and comprising a target code generator, which is coupled to apply each of the target codes in sequence to the second input of the comparator, so as to generate the histogram of the output codes.

9. A chip according to claim 8, wherein the target code generator is arranged to apply each of the sequence of target codes to the comparator for a substantially equal number of cycles of the clock signal, during which the ADC receives the input signal and generates the output codes.

10. A chip according to claim 6, wherein the pulse generator is arranged to convey the pulses to a count probe applied to the chip, so as to carry the pulses to off-chip test equipment for counting the pulses and producing the histogram of the output codes.

11. A chip according to claim 6, wherein the ADC is arranged to receive the input signal from a signal probe applied to the chip, which conveys the input signal to the chip from off-chip test equipment.

12. A method for testing an integrated circuit chip, comprising:

applying an input signal to analog circuitry on the chip, the circuitry including an analog/digital converter (ADC) that is arranged to produce, responsive to the input signal, a range of digital output codes at an output rate determined by a clock signal coupled to the ADC;

comparing the output codes from the ADC, using a comparator on the chip, to a sequence of target codes covering at least a portion of the range of the output codes, so as to generate pulses for output from the chip at a pulse rate determined by the clock signal whenever the output and target codes are equal; and counting the pulses generated for each of the target codes so as to produce a histogram of the output codes.

13. A method according to claim 12, wherein the pulse rate is equal to the output rate of the ADC.

14. A method according to claim 12, wherein counting the pulses comprises applying each of the target codes in sequence to the comparator, so as to produce the histogram of the output codes.

15. A method according to claim 14, wherein applying each of the target codes comprises applying each of the target codes for a substantially equal number of cycles of the clock signal, during which the ADC receives the input signal and generates the output codes.

16. A method according to claim 12, wherein counting the pulses comprises conveying the pulses to off-chip test equipment for counting the pulses and producing the histogram of the output codes.

17. A method for testing an integrated circuit chip, comprising:

applying an input signal to analog circuitry on the chip, the circuitry including an analog/digital converter (ADC) that is arranged to produce, responsive to the input signal, a range of digital output codes at an output rate determined by a clock signal coupled to the ADC;

comparing the output codes from the ADC, using a comparator on the chip, to a sequence of target codes covering at least a portion of the range of the output codes, so as to generate pulses for output from the chip at a pulse rate determined by the clock signal whenever the output and target codes are equal; and counting the pulses generated for each of the target codes so as to produce a histogram of the output codes, wherein applying the input signal comprises conveying the input signal to the chip via a radio frequency (RF) probe from off-chip test equipment.

18. A method according to claim 12, and comprising analyzing the histogram to determine one or more operating characteristics of the analog circuitry.

19. Apparatus for generating a histogram of output codes produced by an analog/digital converter (ADC) on an integrated circuit chip, the ADC producing the output codes at an output rate determined by a clock signal coupled to the ADC, responsive to an input signal applied to the ADC, the apparatus comprising:

a signal generator, arranged to apply the input signal to analog circuitry on the chip, the circuitry including the analog/digital converter (ADC);

test circuitry on the chip, coupled to compare the output codes to a sequence of target codes covering at least a portion of a range of the output codes, so as to generate pulses for output from the chip at a pulse rate determined by the clock signal whenever the output and target codes are equal; and a counter, arranged to receive and count the pulses generated for each of the target codes.

20. Apparatus according to claim 19, wherein the pulse rate is equal to the output rate of the ADC.

21. Apparatus according to claim 19, wherein the test circuitry is controlled to compare each of the target codes to the output codes for a substantially equal number of cycles of the clock signal, during which the ADC receives the input signal and generates the output codes.

22. Apparatus for generating a histogram of output codes produced by an analog/digital converter (ADC) on an integrated circuit chip, the ADC producing the output codes at an output rate determined by a clock signal coupled to the ADC, responsive to an input signal applied to the ADC, the apparatus comprising:

a signal generator, arranged to apply the input signal to analog circuitry on the chip, the circuitry including the analog/digital converter (ADC);

test circuitry on the chip, coupled to compare the output codes to a sequence of target codes covering at least a portion of a range of the output codes, so as to generate pulses for output from the chip at a pulse rate determined by the clock signal whenever the output and target codes are equal; and a counter, arranged to receive and count the pulses generated for each of the target codes, wherein the signal generator and the counter comprise test equipment separate from the chip, and comprising radio frequency (RF) probes for conveying the input signal to the analog circuitry and for conveying the pulses to the counter.

23. Apparatus according to claim 19, and comprising a histogram analyzer, coupled to receive pulse counts generated by the counter and to produce the histogram of the output codes, and to analyze the histogram to determine one or more operating characteristics of the analog circuitry.

* * * * *